(12) United States Patent
Drapkin et al.

(10) Patent No.: US 7,212,592 B2
(45) Date of Patent: May 1, 2007

(54) DIGITALLY PROGRAMMABLE GAIN CONTROL CIRCUIT

(75) Inventors: Oleg Drapkin, Richmond Hill (CA); Antonio Rinaldi, Maple (CA); Mikhall Rodionov, Toronto (CA); Grigori Temkine, Markham (CA); Michael Foxcroft, Toronto (CA); Edward G. Callway, Toronto (CA)

(73) Assignee: ATI Technologies Inc., Markham, Ontario (CA)

( * ) Notice: Subject to any disclaimer, the term of this patent is extended or adjusted under 35 U.S.C. 154(b) by 896 days.

(21) Appl. No.: 10/151,483

(22) Filed: May 20, 2002

(65) Prior Publication Data

US 2003/0215033 A1    Nov. 20, 2003

(51) Int. Cl.
    *H04L 27/08*    (2006.01)

(52) U.S. Cl. ............... 375/345; 341/138; 341/139; 341/140; 330/129; 330/133

(58) Field of Classification Search ........... 341/138, 341/139, 140; 330/129, 133; 375/345
    See application file for complete search history.

(56) References Cited

U.S. PATENT DOCUMENTS

| 4,951,763 | A | * | 8/1990 | Zimmerman et al. | 177/164 |
| 5,300,736 | A | * | 4/1994 | Ehrhardt | 177/145 |
| 5,668,501 | A | * | 9/1997 | Venes | 330/254 |
| 6,441,684 | B1 | * | 8/2002 | Nakamura | 330/9 |
| 2002/0094788 | A1 | * | 7/2002 | Hayashi et al. | 455/73 |

* cited by examiner

*Primary Examiner*—Jean B. Corrielus
*Assistant Examiner*—Nader Bolourchi
(74) *Attorney, Agent, or Firm*—Vedder, Price, Kaufman & Kammholz, P.C.

(57) ABSTRACT

A digitally programmable gain control circuit and method of operating the same is disclosed. The gain control circuit includes a programmable gain amplifier having an amplifier structure represented by a plurality of overlapping discrete monotonic transfer function segments, wherein at least one point of non-monotonicity occurs among one or more of the plurality of overlapping discrete monotonic transfer function segments, and a gain segment translator circuit operative to translate a monotonic gain value to a segment code to match the non-monotonic characteristics of the programmable gain amplifier. The programmability of the gain amplifier is provided by a coarse gain control circuit and a fine gain control circuit.

10 Claims, 8 Drawing Sheets

DIGITALLY PROGRAMMABLE GAIN CONTROL CIRCUIT

FIELD OF THE INVENTION

The present invention generally relates to gain control amplifiers and, more particularly, to a programmable gain control circuit used to adjust the amplitude of an input signal.

BACKGROUND OF THE INVENTION

In order to optimize the accuracy of an analog-to-digital converter (ADC), it is necessary to condition the input analog signal such that its amplitude is just within the full-scale range of the ADC. Input signal amplitude conditioning is conventionally accomplished through use of digitally programmable gain controllers configured in an automatic gain control (AGC) loop. Programmable gain controllers are conventionally based on amplifiers configured with switching resistive feedback networks, known as programmable gain amplifiers (PGA). A drawback associated with such resistive networks is that when monotonic (e.g. no jumps in signal characteristic magnitude) control is needed to condition a particular signal, the corresponding gain control components of the resistive network cannot guarantee monotonicity due to device mismatching when the number of control bits increases to maintain accuracy.

Manufacturing process variations can result in the components (e.g. transistors and resistors) used to fabricate the PGA to have different than expected values or different values relative to corresponding components that are to have the same value; thereby, resulting in corresponding variations in gain amplitude. Variations in gain magnitude can cause the resulting amplifier to exhibit non-monotonic operating characteristics. FIG. 3 is a graph of gain versus a representation of the gain control code for a PGA operating in a non-monotonic region. As illustrated, unwanted gaps (g1, g2) are present in the transfer function of the PGA. These gaps result in the PGA providing unstable output values that, in turn, will result in an erroneous signal being provided to a subsequent ADC. In the case of a video signal that is to be rendered by a graphics processor, an erroneous or otherwise unstable input signal may result, for example, in the resulting image being improperly rendered.

Variable gain amplifiers (VGA) have been used in gain controllers to preprocess analog (i.e. audio or video) signals before conversion by an ADC. Conventional VGAs use charge pumps to control the mapping of voltage into corresponding gain. The advantage of VGA's is that the gain is controlled by a continuous voltage instead of a discrete digital value. This provides an inherently monotonic gain control characteristic. A drawback associated with these conventional VGAs is that they employ a structure including at least two charge pumps that charge a capacitor which, in turn, provides the voltage of the VGA. Capacitors suffer from leakage. Capacitor leakage causes the gain of the VGA to change, sometimes dramatically. This unwanted gain change results in the VGA providing signals of varying magnitude that cannot be effectively controlled or relied upon as being accurate. Additionally, any noise captured by the corresponding charge pumps is passed through the VGA to the signal, further affecting the output of the VGA.

Alternative programmable gain control circuits have been employed to prevent the aforementioned problems associated with conventional VGAs. These gain control circuits control the reference voltage that is applied to the ADC; however, the linearity and signal-to-noise ratio of the ADC output is dramatically reduced when the ADC reference range is reduced. Since the purpose of the AGC is to optimize the analog-to-digital conversion, a gain control scheme that reduces ADC performance is not desirable.

Thus, there is a need for a PGA-based programmable gain control circuit exhibiting operating characteristics that are unaffected by manufacturing process variations and component shortcomings.

BRIEF DESCRIPTION OF THE DRAWINGS

The present invention and the associated advantages and features provided thereby, will be best understood and appreciated upon review of the following detailed description of the invention, taken in conjunction with the following drawings, where like numerals represent like elements, in which.

DETAILED DESCRIPTION OF THE INVENTION

Briefly stated, the present invention is directed to a programmable gain control amplifier circuit that is used to condition the amplitude characteristics of an input signal before such signal is transferred to an analog-to-digital converter for subsequent conversion. In an exemplary embodiment, the amplifier circuit of the present invention is used, for example, to condition composite video, S-video and component video inputs prior to analog-to-digital conversion. The programmable circuit includes a programmable gain amplifier represented by a plurality of overlapping discrete monotonic transfer function segments, wherein a point of non-monotonicity occurs among one or more of the plurality of the overlapping discrete monotonic transfer function segments; and a gain segment translator circuit operatively coupled to the programmable gain amplifier circuit and operative to translate a monotonic gain value to a segment code to match non-monotonic characteristics of the programmably controllable gain amplifier.

Operationally, the amplified or conditioned signal is provided by using a programmably controllable gain amplifier having an amplifier structure represented by a transfer function having a plurality of overlapping discrete monotonic transfer function segments and where at least one point of non-monotonicity occurs among one or more of the plurality of overlapping discrete monotonic transfer functions is known; and a monotonic gain value is translated to a segment code to match the non-monotonic characteristics of the programmably controllable gain amplifier.

Figure 1:
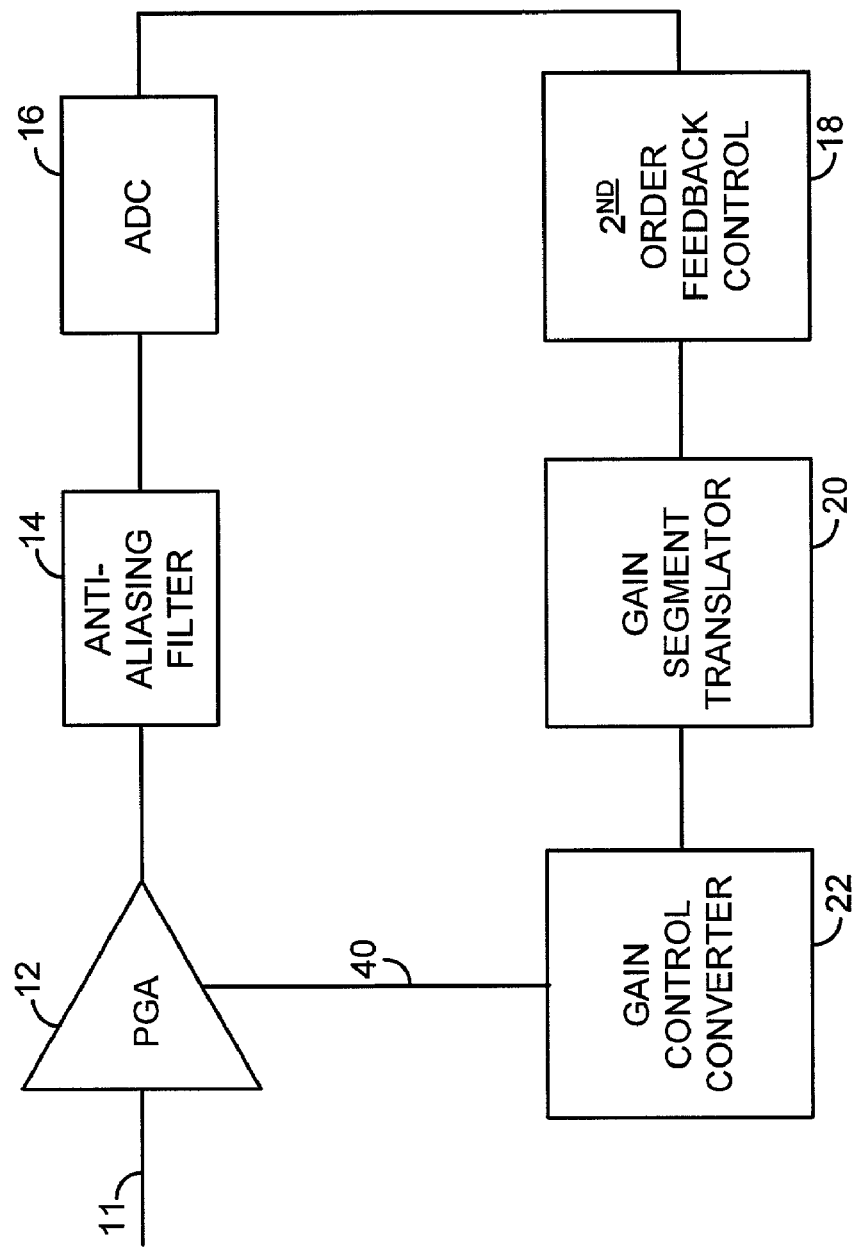
FIG. 1 is a schematic block diagram of the programmable gain control circuit according to the present invention.

An exemplary embodiment of the present invention will now be described with reference to FIGS. 1–8. Referring now to FIG. 1, illustrated therein is a schematic block diagram of the programmable amplifier circuit according to the present invention. The amplifier circuit 10 includes a programmable gain amplifier (PGA) 12, an anti-aliasing filter 14, an analog-to-digital converter (ADC) 16, a second order feedback control block 18, a gain segment translator circuit 20 and a control code conversion block 22. The circuit 10 illustrated in FIG. 1 is used to condition an analog video input signal (on line 11) in the front end of a larger graphics processing system before such conditioned input signal is transmitted to and processed by the graphics processing system. Although described and illustrated as a hardware structure, the functionality and corresponding features of the present invention can also be performed by appropriate software routines or a combination of hardware and software. Thus, the present invention should not be limited to any particular implementation and shall be construed to cover any implementation that falls within the spirit and scope of the present disclosure.

In operation, the PGA 12 receives an input signal on line 11 that is to be converted into a digital signal and subsequently processed by a graphics processor system (not shown). The PGA 12 adjusts the amplitude of the input signal according to the tolerance range of a subsequent analog-to-digital converter (ADC) 16, or in response to programmable control values provided thereto on line 40. The output of the PGA 12 is transmitted to an anti-aliasing filter 14, which is operative to remove higher order distortions or harmonic noise from the transmitted signal. The filtered signal is then transmitted to the ADC 16 for conversion into an appropriate digital signal before being processed by a larger graphics processing system.

The second order feedback control block 18 is coupled to the output of the ADC 16 and is operative to sample the digital signal provided by the ADC 16 and provide a signal representing the gain (monotonic) value of the sampled signal. The output of the second order feedback control block 18 is provided to the gain segment translator circuit 20, which is used to adjust the amplitude level provided by the PGA 12 based on the sampled signal. The gain segment translator circuit 20 receives the signal from the second order feedback control block 18 and provides a corresponding digital signal to the gain control converter 22 which represents a segment code to match the non-monotonic point of the PGA 12 with respect to the input signal. Based on this offset, the operating (e.g. gain) characteristics of the PGA 12 are adjusted, if necessary.

The gain control converter 22 receives the segment code from the gain segment translator circuit 20 and converts the binary value into a gain control code that is applied to the control inputs of the several multistage (i.e. variable) gain control elements that control PGA 12 operation. Thus, the gain segment translator 20 and the gain control converter 22 control the operation of the PGA 12. A more detailed description of the PGA 12, its interconnection with the segment translator circuit 20 and the gain control converter 22 and steps for controlling the same will be described below with reference to FIGS. 2–7.

Figure 2:
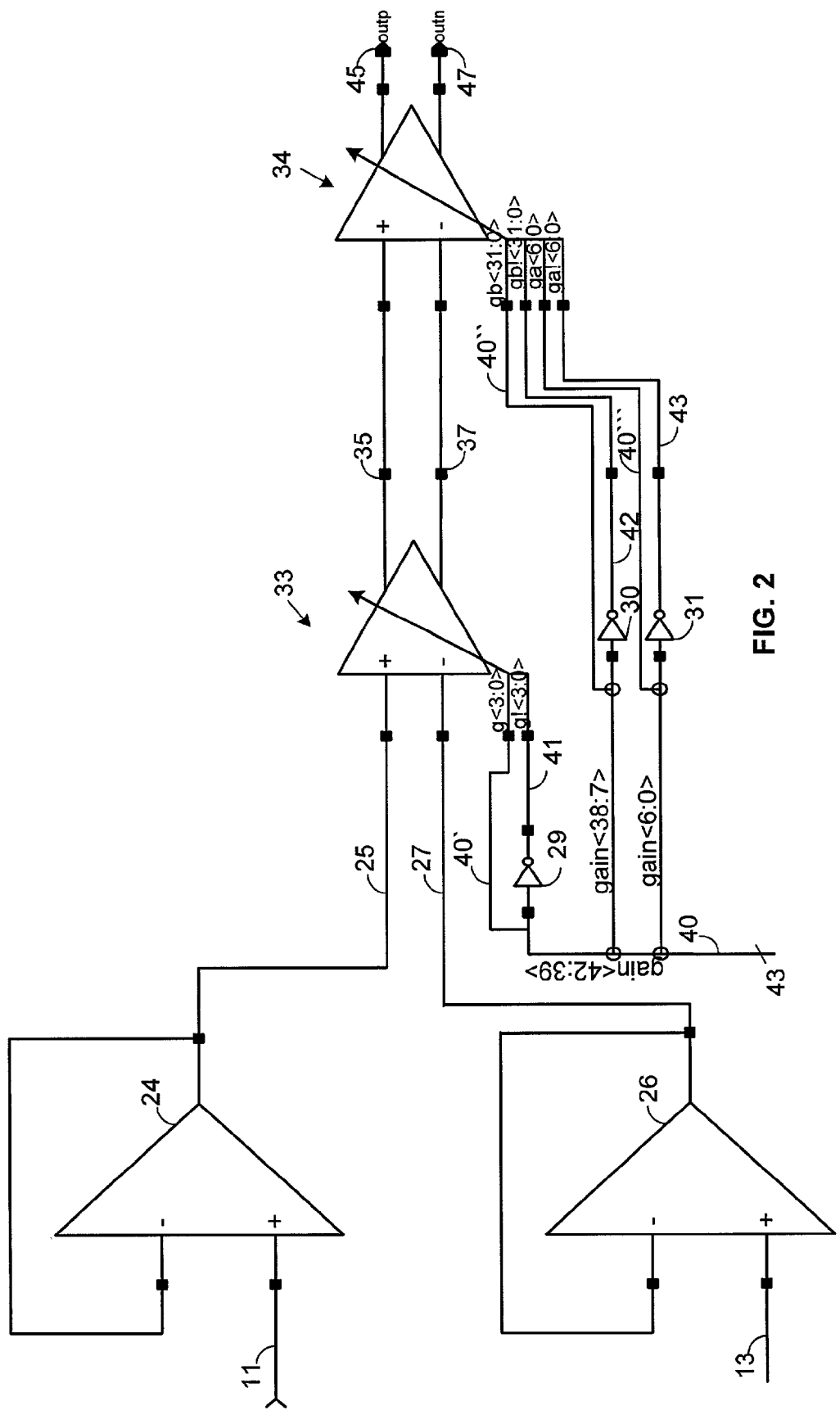
FIG. 2 is a schematic block diagram of the programmable gain amplifier employed in the gain control circuit illustrated in FIG. 1.

FIG. 2 is a schematic block diagram of the PGA 12 employed within the gain control circuit 10 illustrated in FIG. 1. As shown, the PGA 12 includes a first amplifier 24 and a second amplifier 26, comprising the input thereof. The positive input of the amplifier 24 is coupled to the analog input signal on line 11. The negative input of the amplifier 24 is connected as a feedback loop to the output of the first amplifier on line 25. The output of the first amplifier is provided as the positive input to a coarse gain control circuit 33 on line 25.

The positive input of the second amplifier 26 is coupled to a reference signal source on line 13. The negative input of the second amplifier 26 is connected as a feedback loop to the output of the second amplifier on line 27. The output of the second amplifier is provided as the negative input to the coarse gain control circuit 33 on line 27.

Figure 4:
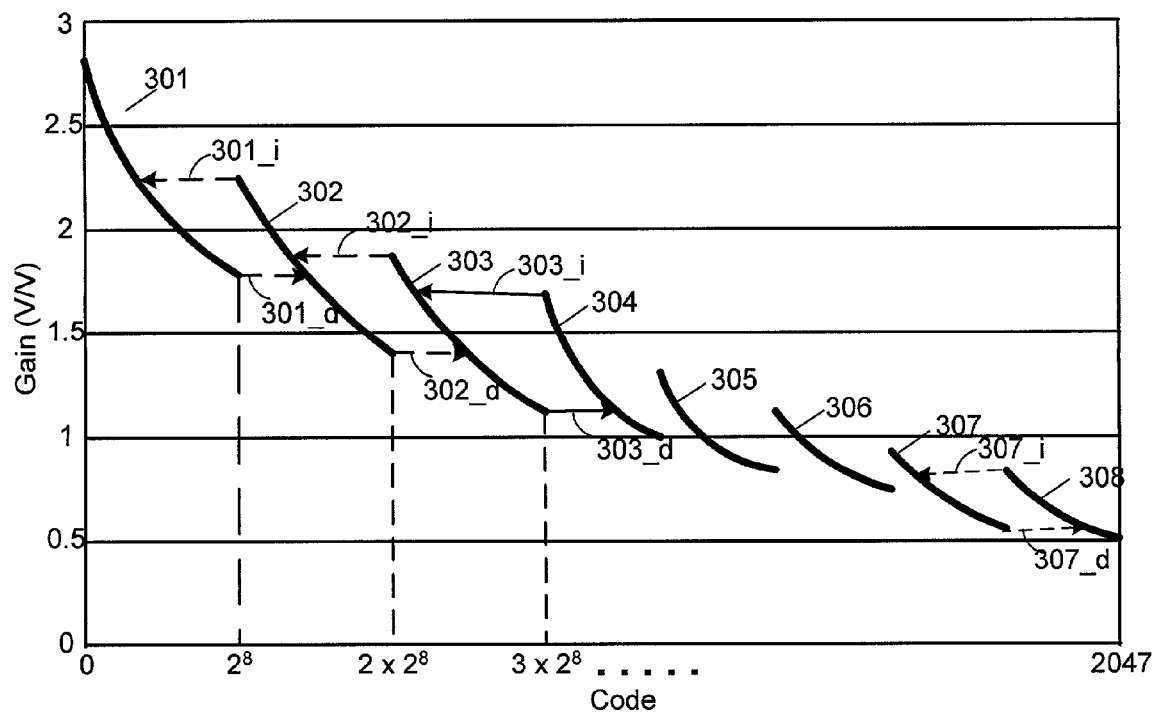
FIG. 4 is a graphical representation of the transfer function having monotonic transfer function segments that defines the operational characteristics of the programmable gain amplifier according to the present invention.
Figure 3:
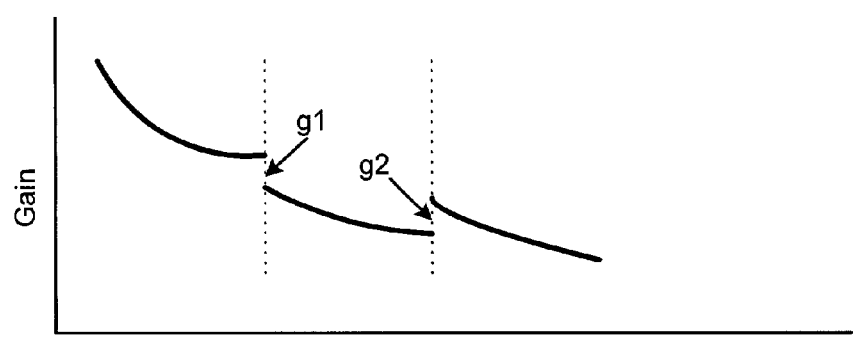
FIG. 3 is a graph illustrating gain versus a representation of the gain control code of a conventional amplifier operating according to a transfer function having non-monotonic points among monotonic transfer function segments.

The coarse gain control circuit 33 is comprised of an operational amplifier configured with programmable resistive feedback, having a first input coupled to the output of the first amplifier on line 25 and a second input thereof coupled to the output of the second amplifier 26 on line 27. The coarse gain control circuit 33 provides for the movement between the several operating segments of the PGA 12 as illustrated in FIG. 4. The coarse gain control circuit 33 is responsive to the application of control signals to the control inputs thereof. More specifically, a segment code provided by the segment translator circuit 20 is converted by the code conversion block 22 to a gain control code 40 and the most significant bits of the gain control code 40 are provided to the coarse gain control circuit 33 on line 40'. The most significant bits of the gain control code, as explained below, adjusts the resistive values associated with the gain control circuit 33; thereby, adjusting the output provided by the coarse gain control circuit 33.

In application, the most significant bits (MSB) gain<42:39> of the gain control code are provided to a first set of control inputs of the coarse gain control circuit 33 on line 40'. Inverted versions of the MSB gain<42:39> are provided to the second control inputs on line 41. Accordingly, the resulting output of the coarse gain control circuit 33 is controlled by the MSB of the control signal transmitted thereto on line 40. The positive output of the coarse gain control circuit 33 is provided on line 35 and the negative output is provided on line 37. The positive output signal on line 35 is coupled as a first input to fine gain control circuit 34. The negative output of the coarse gain control circuit on line 37 is coupled to the second input to the fine gain control circuit 34. The fine gain control circuit 34 is responsible for movement along the individual operating segments of the PGA 12 (FIG. 4).

The fine gain control circuit 34 is implemented as an operational amplifier configured with programmable resistive feedback, having a plurality of control signals coupled thereto, which control the operation and resulting output of the fine gain control circuit 34. In application, bits gain<38:7> of the gain control code are provided as a first set of control inputs on line 40". Inverted version of gain<38:7> are provided to the second set of control inputs on line 42. The least significant bits gain<6:0> of the gain control code are provided to the third set of control inputs on line 40'". Inverted version of bits gain<6:0> of the gain control code are provided to the fourth set of control inputs on line 43.

The positive output of the fine gain control circuit 34 is provided at output 45. The negative output of the fine gain control circuit 34 is provided at output 47. The positive output 45 and negative output 47 of the fine gain control circuit 34 represents the differential output of the PGA 12, which is then transmitted to the anti-aliasing filter 14 (FIG. 1).

FIG. 4 illustrates a graph of gain versus a representation of the gain control code, which represents the transfer function which defines the operating characteristics of the PGA 12 according to the present invention. As illustrated, the transfer function of the PGA 12 includes a plurality of overlapping discrete monotonic transfer function segments 301–308. The transfer function segments are separated by an offset value 301_i to 307_i and 301_d to 307_d, where "i" represents traversing the transfer function in the direction of increasing gain and "d" represents traversing the transfer function in the direction of decreasing gain. The corresponding offset values are used to move the PGA 12 from one transfer function segment to a subsequent transfer function segment during operation. For example, to increase the gain provided by the amplifier from transfer function segment 304 to transfer function segment 303, an offset value 303_i is subtracted from the gain control code value at the end of transfer function segment 304. The process of generating and applying the offset gain control code values will be described in greater detail below with reference to FIGS. 7 and 8.

Each of the transfer function segments 301–308 corresponds to a plurality of gain control codes which are provided to the PGA 12 by the control code conversion block 22 on line 40. Considering the entire transfer function, each gain control code value may be represented as an 11 bit digital value. Of the 11 bits, 3 bits determine the transfer function segment that the PGA operates in, and the remaining 8 bits determine the gain level or value within that segment. Accordingly, movement between the transfer function segments is performed with 11 bits of precision. Note that the plurality of transfer function segments 301–308 are overlapping; therefore, there are no gaps or unwanted separation in between the transfer function segments during operation of the PGA 12 as compared to a conventional programmable gain amplifier. As such, the PGA 12 of the present invention does not succumb to any unwanted gain changes as compared to conventional variable gain amplifiers. Consequently, the programmable gain control circuit 10 of the present invention is able to handle a wide range of gain changes in both the increasing (i.e. from transfer function segment 308 to transfer function segment 301) direction and the decreasing (i.e. gain segment 301 to gain segment 308) direction.

Figure 5:
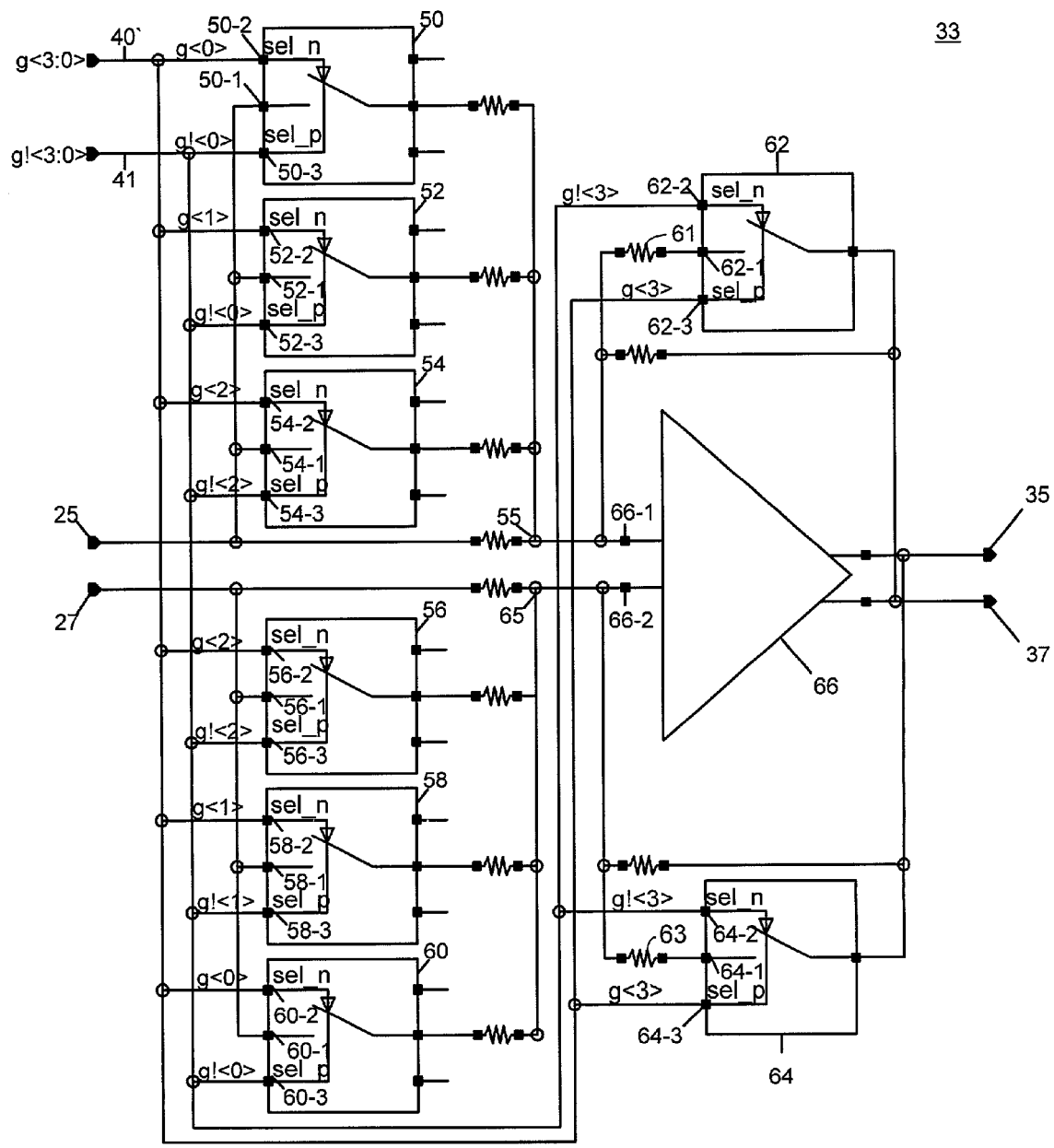
FIG. 5 is an exploded schematic block diagram of the coarse gain control circuit employed in the programmable gain amplifier illustrated in FIG. 2.

FIG. 5 illustrates an exploded block diagram of the components that comprise coarse gain control circuit 33 and its interconnection to the corresponding bits of the gain control code. As shown, the coarse gain control circuit includes a plurality of switches 50–64 that provide a resistive feedback network to amplifier inputs 66-1 and 66-2 based on the gain control code. More specifically, the output of the first amplifier 24 (FIG. 2) is provided as a first data input to switches 50–54, and the output of the second amplifier 26 is provided as a first data input to switches 56–60.

In addition to receiving the input signal from amplifier at their respective data inputs, the several switches 50–60 that provide resistive feedback to the amplifier inputs 66-1 and 66-2 receive appropriate bits of the gain control code at their respective control inputs from lines 40' and 41. As shown in FIG. 5, input 50-2 of switch 50 receives gain control code bit g<0> from line 40' and input 50-3 receives inverted gain control code bit g!<0> from line 41, where the symbol "!" represents logical inversion. Input 52-2 of switch 52 receives gain control code bit g<1> from line 40' and input 52-3 receives inverted gain control code bit g!<1> from line 41. Input 54-2 of switch 54 receives gain control code bit g<2> from line 40' and input 54-3 receives inverted gain control code bit g!<2> from line 41. The corresponding outputs of switches 5–54 are coupled through corresponding resistors to node 55. The voltage present at node 55 is provided to input 66-2 of the amplifier 66 as well as through a resistor 61 to switch 62.

Switches 56–60 are connected to the output of the second amplifier on line 27. In addition, the control inputs of the several switches 56–60 are coupled to the gain control code bits in corresponding fashion to switches 50–54. More specifically, input 56-2 of switch 56 is coupled to gain control code bit g<2> provided on line 40'. Input 56-3 is coupled to inverted gain control code bit g!<2> provided on line 41. Input 58-2 of switch 58 is coupled to gain control code bit g<1> provided on line 40'. Input 58-3 of switch 58 is coupled to inverted gain control code bit g!<1> provided on line 41. Input 60-2 of switch 60 is coupled to gain control code bit g<0> provided on line 40' and input 60-3 is coupled to inverted gain control code bit g!<0> on line 41. The corresponding output of switches 56–60 are coupled through resistors to node 65. The voltage present at node 65 is provided to the negative input 66-1 of amplifier 66 as well as through a resistor 63 to the input of switch 64.

Referring now to switch 62, the first control input 62-2 thereof is coupled to inverted gain control code bit g!<3> provided on line 41, with the second control input 62-3 of switch 62 being coupled to gain control code bit g<3> provided on line 40'. Additionally, control input 64-2 of switch 64 is coupled to inverted gain control code bit g!<3> provided on line 41 and control input 64-2 is coupled to gain control code bit g<3> provided on line 40'. The output of switch 62 is coupled to the negative output of the amplifier 66, which is provided to the negative output of the coarse gain controller on line 37. The output of switch 64 is coupled to the positive output of amplifier 66, which is provided to the the output of the coarse gain controller on line 35.

Figure 6:
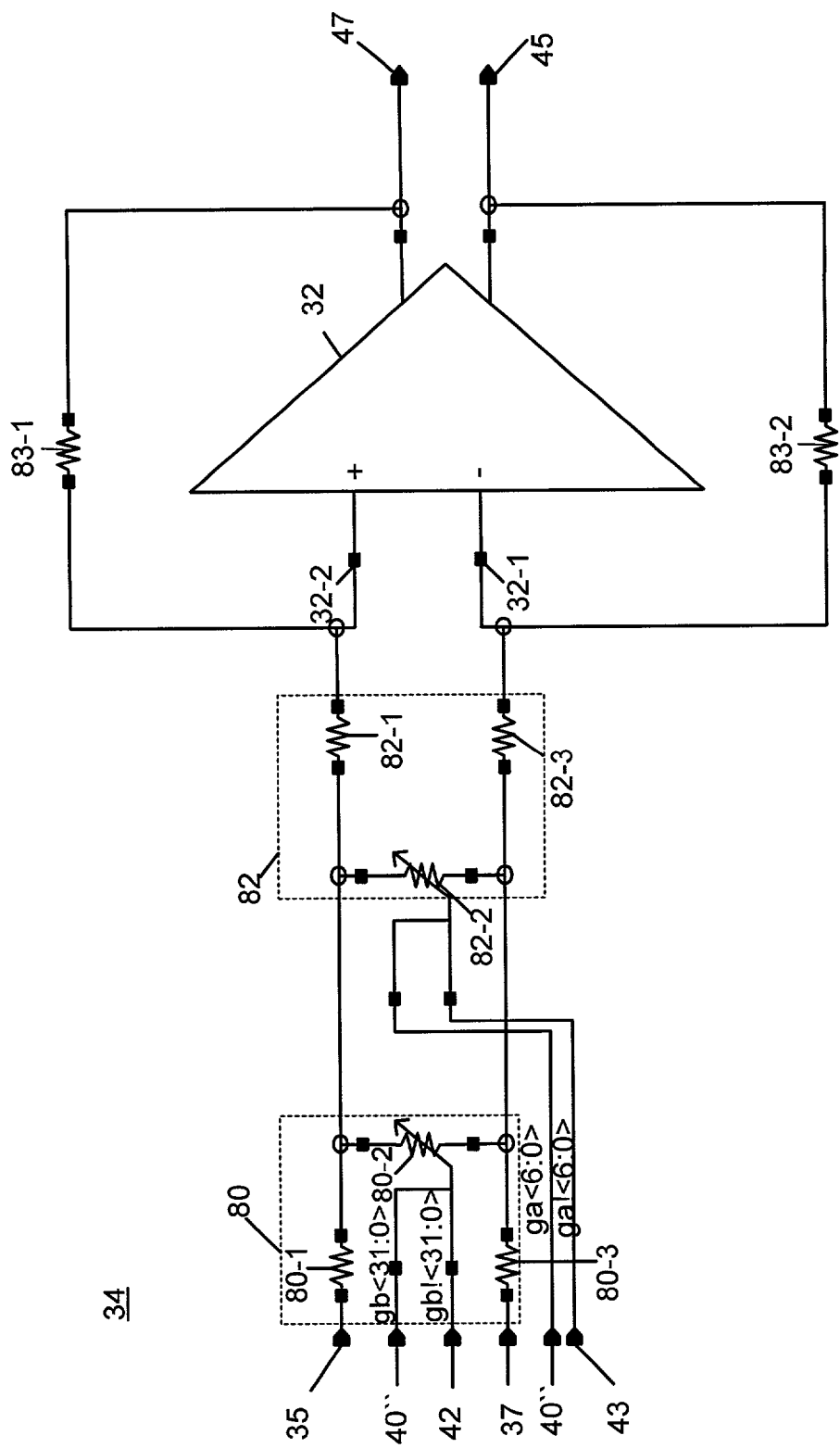
FIG. 6 is an exploded schematic block diagram of the fine gain control circuit employed in the programmable gain amplifier illustrated in FIG. 2.

An exploded schematic block diagram of the components that comprise the fine gain control circuit 34 of the present invention is illustrated in greater detail in FIG. 6. As illustrated, the fine gain control circuit 34 includes a plurality of resistor ladder blocks 80 and 82 which provide the inputs to operational amplifier 32. The output of the amplifier 32 is transmitted to the anti-aliasing filter 14 on output pins 45 and 47.

The first resistor ladder block 80 is comprised of a first resistor (R1) 80-1, a variable resistor 80-2 and a second resistor (R2) 80-3 connected in series. The non-series connected terminal of first resistor (R1) 80-1 is coupled to the output of the coarse gain control circuit on line 35. Similarly, the non-series connected terminal of the second resistor (R2) 80-3 is coupled to the negative output of the coarse gain control circuit provided on line 37. Bits gb<31:0> of the gain control code is provided to the first resistor ladder block on line 40", with the inverted version of bits gb!<31:0> of the gain control code being provided thereto on line 42. The output of the first resistor ladder block 80 is provided to the second resistor ladder block 82.

The second resistor ladder block 82 is comprised of a third resistor (R3) 82-1, a variable resistor 82-2 and a fourth resistor (R4) 82-3 connected in serial relation to one another.

The non-serially connected terminal of resistor 82-1 is provided to the positive input 32-2 of the amplifier 32. In like fashion, the non-series connected terminal of resistor 82-3 is coupled to the negative input 32-1 of amplifier 32. The output of the amplifier 32 consists of an amplified version of the signals presented at input 32-1 and 32-2 respectively.

Resistors 83-1 and 83-2 provide negative feedback from the amplifier outputs to the amplifier inputs. In particular, resistor (R5) 83-1 is connected between the negative output and the positive input of the amplifier. Resistor (R6) 83-2 is connected between the positive output and the negative input of the amplifier. Table 1 below provides the resistor values of the several resistors that comprise the fine gain control circuit 34 of the present invention.

TABLE 1

| Resistor | Ohms |
|---|---|
| R1 | 9K |
| R2 | 9K |
| R3 | 1K |
| R4 | 1K |
| R5 | 16K |
| R6 | 16K |

Bits ga<6:0> of the gain control code are provided as a first input into the second resistor ladder block 82 on line 40". The inverted bits ga!<6:0> of the gain control code are provided as a second input to the second resistor ladder block 82 on line 43. Exemplary methods used to increase and decrease the output gain of the PGA 12 will now be described with reference to FIGS. 7 and 8, respectively.

Figure 7A:
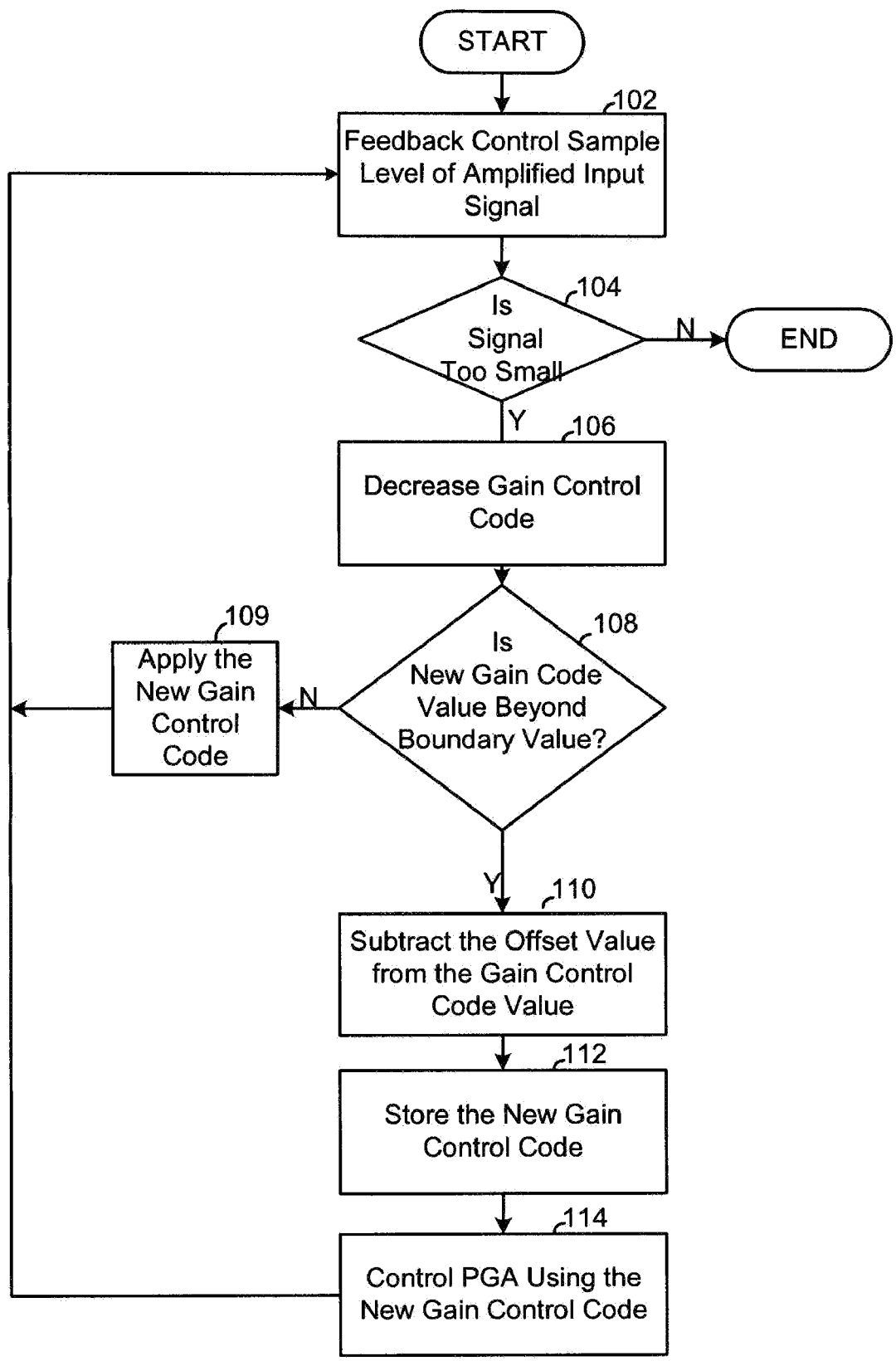
FIG. 7A is a flowchart of the operating steps performed by the gain control circuit illustrated in FIG. 1 when increasing output gain.

FIG. 7A is a flowchart of the operating steps performed by the PGA 12 when increasing output gain. The process begins at step 102 where the feedback control block 18 samples the amplitude level of an amplified input signal. The input signal may be a composite video or S-video signal. The process then moves to step 104.

In step 104, a determination is made as to whether the amplified input signal amplitude is too small (i.e. not within the lower tolerance limits of the ADC 16). If the signal amplitude is too small, the process proceeds to step 106. In step 106, a new gain control code value is retrieved, representing the next gain to be achieved. The process then proceeds to step 108.

In step 108, a determination is made as to whether the new gain control code value is beyond a boundary value associated with the transfer function segment (FIG. 4). If the new gain control value is not beyond the boundary value, the process moves to step 109. In step 109 the new gain control code value is applied to PGA 12 and the process then proceeds back to step 102 where a new sample is taken.

However, if the new gain control code value is determined to be beyond the boundary value in step 108, thereby indicating that the operating mode of the PGA 12 should move, for example, from transfer function segment 304 to transfer function segment 303, the process moves to step 110 where the offset value (e.g. 303_i) is subtracted from the current gain control code value. The resulting gain control code value is stored in step 112 and the process proceeds to step 114.

In step 114, the gain control code value stored in step 112 is applied to PGA 12, resulting in the PGA 12 operating, for example, in the region defined by transfer function segment 303. As the transfer function segments overlap, there are no gaps or otherwise unwanted steps present between the operating regions. Therefore, the output gain of the PGA 12 increased in a stable manner. Thus, the resulting unstable amplifier outputs exhibited by conventional programmable gain amplifiers caused by the gaps in the operating regions thereof are overcome. The process then proceeds back to step 102 where a new sample is taken.

Figure 7B:
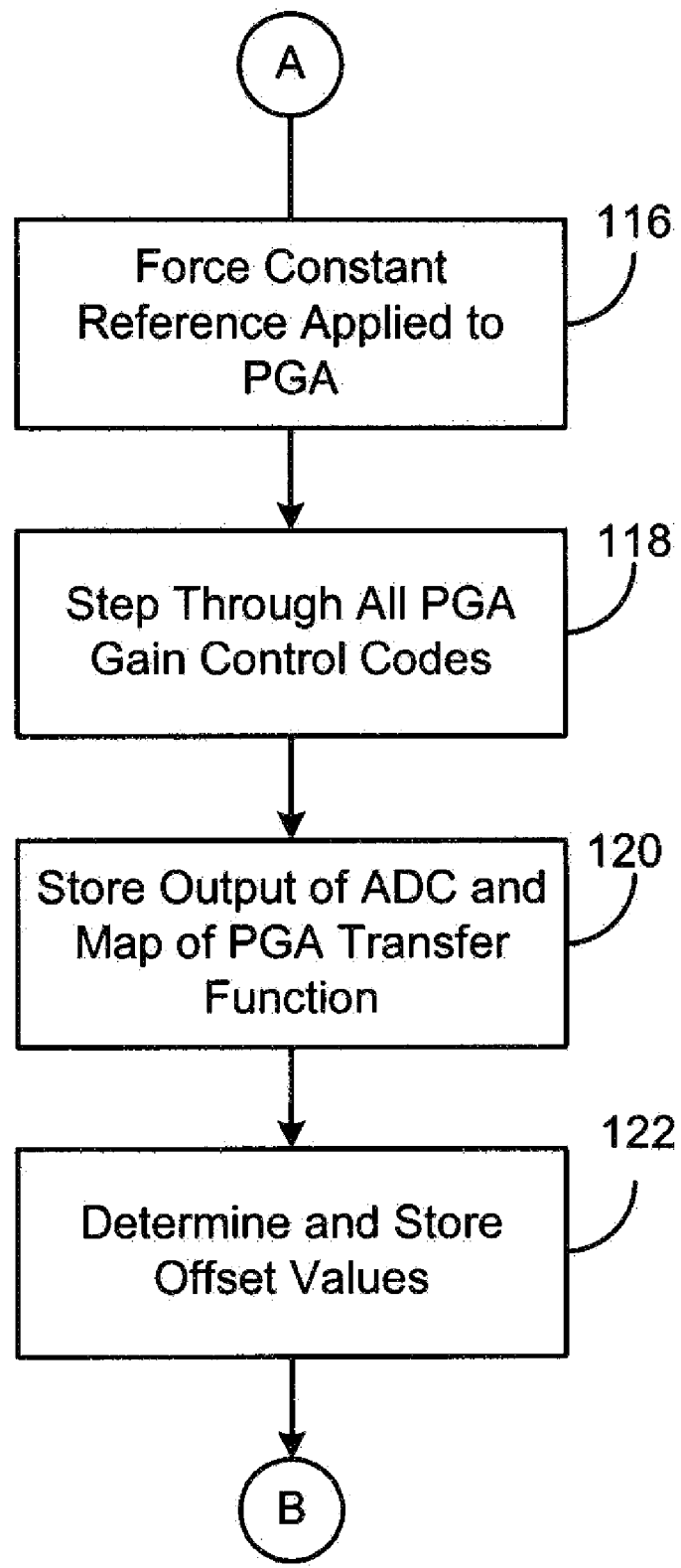
FIG. 7B is a flowchart illustrating the operating steps of the auto calibration function performed by the gain control circuit illustrated in FIG. 1.

In corresponding fashion, if the amplified input signal (from block 16) is determined not to be too small in step 104, no additional gain control code value is generated as the amplified input signal is within proper operating tolerance range. Since the required offset values used in the gain control algorithm may be affected by device mismatch in the PGA components, a calibration of the gain curve is run. This calibration is done automatically during power-up or on idle restart of the circuit 10. The auto calibration routine will now be described with reference to steps 116 to 122 (FIG. 7B).

The auto calibration routine starts at step 116 where a constant voltage value is forced into the PGA 12 on line 11. The process then moves to step 118 where a linear ramp that steps through all the gain control codes is applied to the gain control inputs of PGA 12 on line 40. The process then moves to step 120.

In step 120, the output of the ADC 16 and the transfer function of the PGA 12 are stored in the gain segment translator circuit 20. The process then proceeds to step 122.

In step 122, offset values are determined by calculating the value at the end of a particular segment (e.g. segment 304) and the corresponding point in the new segment (e.g. segment 303) of the transfer function. The step further includes storing at least one offset value associated with each of the plurality of overlapping discrete monotonic transfer function segments. In one embodiment, for example, the programmable amplifier circuit of FIG. 1 includes memory operative to store offset values associated with one or more of the plurality of overlapping discrete monotonic transfer function segments. That difference in values is the offset gain control code value which will be subtracted from the current gain control code value (e.g. associated with segment 304) in step 110 of FIG. 7A.

Thus, by performing the operating steps discussed above with reference to FIGS. 7A and 7B, the PGA 12 of the present invention provides stable output gain characteristics due to the overlapping nature of the gain amplifier transfer function segments. In addition, the gain can be controlled through the applications of gain control codes to the coarse control circuit and fine gain control circuit of the programmable gain amplifier.

Figure 8:
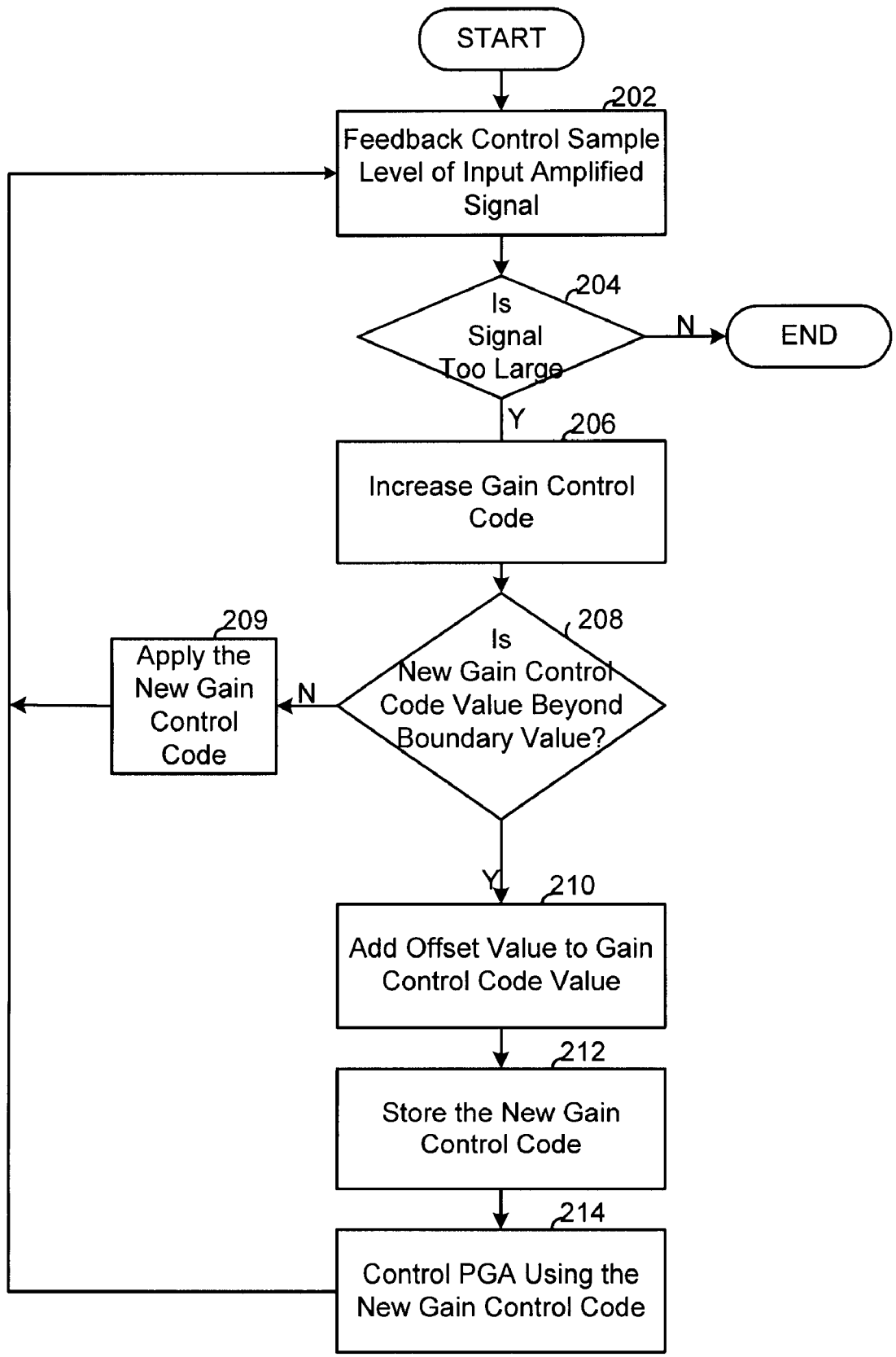
FIG. 8 is a flowchart of the operating steps performed by the gain control circuit illustrated in FIG. 1 when decreasing output gain.

FIG. 8 is a flowchart of the steps performed by the PGA 12 when decreasing the output gain of the PGA 12 according to the present invention. The process begins at step 202 where the feedback control block 18 samples the amplitude level of the amplified input signal. The input signal may be a composite video or S-video signal. The process then moves to step 204.

In step 204, a determination is made as to whether the amplified input signal amplitude is too large (i.e. not within the upper tolerance limits of the ADC 16). If the signal amplitude is too large, the process proceeds to step 206. In step 206, a new gain control code value is retrieved, representing the next gain to be achieved. The process then proceeds to step 208.

In step 208, a determination is made as to whether the new gain control code value is beyond a boundary value associated with the transfer function segment (FIG. 4). If the new gain control code value is not beyond the boundary value, the process moves to step 209. In step 209 the new gain control code value is applied to PGA 12 and the process then proceeds back to step 202 where a new sample is taken.

However, if the new gain control code value is determined to be beyond the boundary value in step 208, thereby indicating that the operating mode of the PGA 12 should move, for example, from transfer function segment 302 to transfer function segment 303, the process moves to step 210 where the offset gain control value (e.g. 302_d) is added to the current gain control code value. The resulting gain control code value is stored in step 212 and the process proceeds to step 214.

In step 214, the gain control code value stored in step 212 is applied to PGA 12, resulting in PGA 12 operating, for example, in the region defined by transfer function segment 303. As the transfer function segments overlap, there are no gaps or otherwise unwanted steps present between the operating regions. Therefore, the output gain of the PGA 12 decreases in a stable manner. Thus, the resulting unstable amplifier outputs exhibited by conventional voltage gain amplifiers caused by the gaps in the operating regions thereof are overcome. The process then proceeds back to step 202 where a new sample is taken.

In corresponding fashion, if the amplified input signal (from block 18) is determined not to be too large in step 204, no additional gain control code is generated as the input signal is within proper operating tolerance range.

The above detailed description of the present invention and the examples described therein have been presented for the purposes of illustration and description. It is therefore contemplated that the present invention cover any and all modifications, variations or equivalents that fall within the spirit and scope of the basic underlying principles disclosed and claimed herein.

What is claimed is:

1. A method for providing an amplified signal, comprising:
    using a programmable gain amplifier having an amplifier structure represented by a plurality of overlapping discrete monotonic transfer function segments wherein at least one point of non-monotonicity among one or more of the plurality of overlapping discrete monotonic transfer function segments is known; and
    translating a monotonic gain value to a segment code to match non-monotonic characteristics of the programmable gain amplifier.

2. The method of claim 1, further including storing at least one offset value associated with each of the plurality of overlapping discrete monotonic transfer function segments.

3. The method of claim 2, further including determining the at least one point of non-monotonicity among the one or more of the plurality of overlapping discrete monotonic transfer function segments that define the amplifier structure by performing an auto calibration operation prior to storing the at least one offset value.

4. The method of claim 3, wherein performing the auto calibration operation includes:
    providing a constant voltage into at least one input of the programmable gain amplifier;
    providing a linear ramp of gain control codes into the gain control inputs of the programmable gain amplifier;
    storing output data from an analog to digital converter that is operatively coupled to the programmable gain amplifier; and
    determining the at least one point of non-monotonicity among the one or more of the plurality of overlapping discrete monotonic transfer function segments associated with the programmable gain amplifier based on the stored output data from the analog to digital converter to obtain at least one offset value.

5. The method of claim 1 further comprising providing a gain control code to the programmable gain amplifier associated with a first discrete monotonic transfer function segment where a previous gain control code provided to the programmable gain amplifier was associated with a second discrete monotonic transfer function segment.

6. The method of claim 5, wherein the gain control code is a digital code having most significant bits and least significant bits and wherein the most significant bits set a coarse gain setting of the programmable gain amplifier, and the least significant bits set a fine gain setting of the programmable gain amplifier.

7. An amplifier circuit, comprising:
    a programmable gain amplifier having an amplifier structure represented by a plurality of overlapping discrete monotonic transfer function segments wherein at least one point of non-monotonicity occurs among one or more of the plurality of overlapping discrete monotonic transfer function segments; and
    a gain segment translator circuit operatively coupled to the programmable gain amplifier circuit and operative to translate a monotonic gain value to a segment code to match non-monotonic characteristics of the programmable gain amplifier.

8. The amplifier circuit of claim 7, further comprising a gain control converter operatively coupled to the gain segment translator to produce a gain control code based on at least the segment code.

9. The amplifier circuit of claim 8, wherein the programmable gain amplifier includes at least:
    a first amplifier,
    a second amplifier,
    a coarse gain control circuit having at least a first and second input operatively coupled to an output of each of the first and second amplifier and operatively responsive to at least a portion of the gain control code; and
    a fine gain control circuit having an input operatively coupled to an output of the coarse gain control circuit and operatively responsive to at least another portion of the gain control code.

10. The amplifier circuit of claim 9, wherein the gain control code is a digital code having most significant bits and least significant bits and wherein the most significant bits set a coarse gain setting of the coarse gain amplifier, and the least significant bits set a fine gain setting of the fine gain amplifier.

* * * * *

UNITED STATES PATENT AND TRADEMARK OFFICE
CERTIFICATE OF CORRECTION

| | | |
|---|---|---|
| PATENT NO. | : 7,212,592 B2 | Page 1 of 1 |
| APPLICATION NO. | : 10/151483 | |
| DATED | : May 1, 2007 | |
| INVENTOR(S) | : Oleg Drapkin et al. | |

It is certified that error appears in the above-identified patent and that said Letters Patent is hereby corrected as shown below:

Title page, item (75) please delete "Mikhall Rodionov" and replace with "Mikhail Rodionov".

Signed and Sealed this
Fourteenth Day of June, 2011

David J. Kappos
*Director of the United States Patent and Trademark Office*